(12) United States Patent
Walker

(10) Patent No.: US 6,280,507 B1
(45) Date of Patent: Aug. 28, 2001

(54) AIR MANAGER APPARATUS AND METHOD FOR EXHAUSTED EQUIPMENT AND SYSTEMS, AND EXHAUST AND AIRFLOW MANAGEMENT IN A SEMICONDUCTOR MANUFACTURING FACILITY

(75) Inventor: Bruce Walker, Kuna, ID (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 09/515,485

(22) Filed: Feb. 29, 2000

(51) Int. Cl.$^7$ .................................................. B01D 46/00
(52) U.S. Cl. ................ 95/273; 55/DIG. 18; 55/DIG. 29; 454/187
(58) Field of Search ............................... 55/385.1, 385.2, 55/DIG. 18, DIG. 29; 454/187, 188, 189, 190, 191, 192, 193; 438/905, 909

(56) References Cited

U.S. PATENT DOCUMENTS

| | | | |
|---|---|---|---|
| 4,927,438 | * | 5/1990 | Mears ................................... 55/385.2 |
| 5,261,935 | * | 11/1993 | Ishii et al. ............................ 55/385.2 |
| 5,626,820 | * | 5/1997 | Kinkead et al. ..................... 55/385.2 |
| 5,827,339 | * | 10/1998 | Nagafune et al. ................... 55/385.2 |
| 5,833,726 | * | 11/1998 | Kinkead et al. ..................... 55/385.2 |
| 5,858,041 | * | 1/1999 | Luetkemeyer ....................... 55/385.2 |
| 5,946,221 | | 8/1999 | Fish, Jr. et al. . |
| 5,953,884 | | 9/1999 | Lawecki et al. . |
| 6,007,595 | | 12/1999 | Baik et al. . |
| 6,009,894 | | 1/2000 | Trussart . |
| 6,033,301 | * | 3/2000 | Suwa ................................... 55/385.2 |
| 6,048,499 | * | 4/2000 | Hirayama ............................ 55/385.2 |
| 6,168,085 | * | 1/2001 | Garcia ................................. 55/385.2 |

* cited by examiner

Primary Examiner—David A. Simmons
Assistant Examiner—Minh-Chau T. Pham
(74) Attorney, Agent, or Firm—Oliver A. Zitzmann; Robert A. McLauchlan, III; Steven J. Hultquist

(57) ABSTRACT

An air manager for the containment of hazardous fumes over a liquid chemical tank in exhausted equipment and systems in a clean room. A powered, filtered airflow source forces filtered air through a plenum coextensive with a transverse dimension of the chemical tank, in a sheet-like airflow stream over the liquid surface. The airflow is captured at the opposite side of the liquid chemical tank and directed to a powered exhaust. The air manager works cooperatively with the clean room laminar airflow, dramatically increasing the efficiency of the local exhaust. Critical Capture Velocity over the entire surface of the tank is maintained, assuring complete containment of chemical fumes. Optional airflow guides positioned along the sides of the chemical tank may be employed to confine the air stream to the area over the liquid surface.

20 Claims, 4 Drawing Sheets

AIR MANAGER APPARATUS AND METHOD FOR EXHAUSTED EQUIPMENT AND SYSTEMS, AND EXHAUST AND AIRFLOW MANAGEMENT IN A SEMICONDUCTOR MANUFACTURING FACILITY

BACKGROUND OF THE INVENTION

1. Field of the Invention

The present invention generally relates to airflow in controlled environments. More particularly, the present invention relates to improved process equipment exhaust and airflow management in clean room and mini-environment enclosures.

2. Description of the Related Art

Semiconductor manufacturing must be performed in a particle-free environment, due to the fact that submicron size dimensions characterize the structural elements of the electronic circuitry and such circuitry can be rendered inoperative by the presence of even a single particle. Semiconductor manufacturing process steps are therefore carried out within the confines of a clean room, a controlled environment in which the air is continuously filtered to remove dust, lint, and other particulate matter. Processes and apparatuses for managing forced airflow in clean rooms and other environmentally controlled enclosures are well known in the art.

U.S. Pat. No. 6,007,595, issued to Baik, et al. on Dec. 28, 1999, discloses the use of an isolation bar arranged across the central region of an air filtration unit in a laminar flow clean room, allowing for the placement of a partitioning panel across the central region of a filter while preventing turbulence downstream of the areas where the panels would otherwise block air flow through the filter.

U.S. Pat. No. 5,953,884, issued to Lawecki, et al. on Sep. 21, 1999, discloses an apparatus and method for manufacturing syringe bodies that are substantially free from contaminants, by forming and packaging the items in a mini-environment maintained at clean room standards of at least class 100, using horizontal and vertical laminar airflows directed into air filter units.

Many semiconductor manufacturing process steps involve the use of chemicals that are toxic or otherwise hazardous to humans, necessitating localized exhaust equipment to remove, contain, or otherwise abate fumes from such chemicals. Apparatuses and methods for local exhaust are known in the art.

U.S. Pat. No. 6,009,894, issued to Michel Trussart on Jan. 4, 2000, discloses a rapid response airflow rate-regulating device, for installation in a vacuum unit that collects contaminants from a processing station in a clean room. The device enables the vacuum unit to maintain a continuous suction of contaminant particles from the processing station when there are pressure variations in the controlled space, as for example may occur by opening a door for entry or egress of personnel.

U.S. Pat. No. 5,946,221, issued to Fish, Jr., et al. on Aug. 31, 1999, discloses a means for controlling air flow through a laboratory fume hood based on air flow face velocity. The air flow control system disclosed in Fish, Jr., et al. allows maintenance of a velocity of exhaust air flow through the fume hood sufficient to abate the hazard posed by chemical fumes, but below the level at which turbulence would interfere with the experiment or process being performed at the workstation protected by the fume hood.

Typically, semiconductor manufacturing process steps involving liquid chemical baths ("exhausted equipment and systems") in a clean room have a local exhaust associated therewith. Efficiency of the exhaust (i.e., the exhaust energy necessary to remove hazardous chemical fumes at the exhausted equipment and systems) is a function of the interdependent relationship between the station exhaust ("pull") and the laminar airflow from the clean room ceiling ("push"). These two motive forces of airflow form the push-pull system that is the basis for system exhaust operation.

The actual flow rate through exhausted equipment and system exhaust can be characterized by $C_e$, the Coefficient of Entry. $C_e$ is defined by the American Conference of Governmental Industrial Hygienists as:

"The actual rate of flow caused by a given hood static pressure compared to the theoretical flow which would result if the static pressure could be converted to velocity pressure with 100% efficiency. The ratio of actual to theoretical flow."

Maximum possible exhausted equipment and system exhaust duct velocity is achieved when $C_e=1.0$. Typical $C_e$ values range from 0.2 to 0.7 (for highly efficient exhausted equipment and systems). In general, the greater the distance between air source and exhaust, the smaller is the value for Ce.

Unobstructed, the ceiling-to-floor laminar airflow in a clean room loses relatively little volumetric flow velocity. Typically, an 80 feet per minute (fpm) laminar airflow as measured at the ceiling will be attenuated to approximately 71 fpm at the deck level, away from exhausted equipment and systems. As air is pulled into the exhausted equipment and systems and subsequently through the exhaust located beneath the exhausted equipment and systems deck, other influences, most notably a chemical tank, reduce airflow velocity by inducing turbulence, and by bending and separating air streams. The clean room "push" is thereby reduced to a velocity insufficient to fully contain and remove chemical fumes.

At the same time, the exhausted equipment and system exhaust "pull" is insufficient to significantly increase airflow velocity over a chemical tank. Only high exhaust volumes and consistently high laminar airflow velocities from the ceiling system are able to maintain fume capture in the process area.

Because of these factors, most exhausted equipment and systems exhibit marginal fume capture capability, and many fail to consistently control contamination and hazardous fumes at the deck, resulting in occasional fumes spills into the process and operator environment.

In characterizing airflow in relation to a process tank in a clean room environment, Critical Capture Velocity (CCV) is defined as the minimum airflow velocity measured over a process tank at which fumes will be controlled below the station deck. A properly balanced system can achieve this velocity (empirically determined to be at values of 70 fpm or greater) with a combination of exhaust flow rate, laminar airflow, and minimal deck opening size, if enough exhaust capacity is available.

As wafer sizes used in the semiconductor industry grow to 300 mm or more and require larger deck openings, however, CCV becomes more difficult to achieve, and facility exhaust capacity is stretched beyond its limits. Conventional push-pull systems will not be able to produce enough combined force to achieve capture of hazardous fumes in large size wafer facilities now under design and construction.

Additionally, many 200-millimeter (mm)-exhausted equipment and systems in current use are unable to achieve CCV because of a disparity in the exhaust capacity, deck opening sizes, and laminar push. Consequently, fume spill incidents occur in many wafer fabs, resulting in yield loss, excessive rework, process disruption, environmental and regulatory noncompliance, injury, and litigation. Additionally, the economics of the semiconductor market demand a reduction in overall production costs as semiconductor fabs move to larger wafer sizes. The international semiconductor industry association SEMATECH has determined a need to reduce exhaust energy consumption by a magnitude of 35 to 40% from current average levels, even as progressively increasing wafer sizes necessitate larger, higher capacity, higher energy consumption exhaust systems.

It therefore is one object of the present invention to provide an improved exhausted equipment and systems exhaust system.

It is another object of the invention to provide such exhausted equipment and systems exhaust system, having increased efficiency, generating sufficient airflow for hazardous fume containment while consuming less energy.

It is a further object of the present invention to provide an exhausted equipment and systems exhaust system that assures maintenance of CCV at values of 70 fpm or greater.

It is still a further object of the present invention to provide an exhausted equipment and systems exhaust system that provides control of hazardous fumes outside the process envelope region of the facility and outside of the operator's breathing zone.

It is a still further object of the present invention to increase the $C_e$ of an exhausted equipment and systems exhaust system toward a value of unity.

Other objects and advantages of the invention will be more fully apparent from the ensuing disclosure and appended claims.

SUMMARY OF THE INVENTION

The present invention relates to an improved exhausted equipment and systems exhaust system for airflow management in a semiconductor manufacturing facility.

The present invention in one aspect provides active filtered airflow "push" elements, located proximate to the exhausted equipment and systems exhaust and in such a position as to direct filtered airflow across the surface of a chemical tank, thereby capturing hazardous fumes rising therefrom. Directed airflow is filtered to an efficiency of 99.9999%.

The present invention in a specific apparatus aspect relates to an air manager and chemical tank assembly, comprising:

a filtered airflow source constructed and arranged to direct airflow in an airflow stream;

a liquid chemical tank arranged for containing a liquid chemical having deleterious fumes emanating from the surface thereof; and an airflow exhaust having an inlet for receiving said filtered airflow;

wherein the filtered airflow source is positioned above and adjacent to one side of the liquid chemical tank and the inlet to the powered exhaust is positioned in proximity to an opposite side of the liquid chemical tank, such that airflow from the filtered airflow source is directed over the surface of the liquid chemical and into the exhaust inlet, whereby substantially all deleterious fumes emanating from the surface of the chemical are captured by and entrained in the airflow, and transported to the exhaust.

Another aspect of the invention relates to a wet station assembly of a semiconductor manufacturing facility, said wet station assembly comprising a deck having a liquid chemical tank positioned beneath the deck, with an opening in the deck over the liquid chemical tank for ingress and egress of semiconductor manufacturing workpieces, a laminar downflow air source, a below-deck exhaust for the wet station assembly and a below-deck airflow source positioned in relation to the exhaust to flow an airstream over a surface of liquid in the liquid chemical tank at a sufficient rate and in a sufficient volumetric flow to achieve Critical Capture Velocity (CCV) of vapor released from the liquid during operation of the wet station assembly.

The present invention in a specific method aspect relates to a method of containing hazardous flumes emanating from the surface of a liquid chemical in a liquid chemical tank, comprising:

providing a filtered airflow source at a position above and adjacent to one side of the liquid chemical tank or in a counterflow, opposing air manager device configuration; providing an airflow exhaust having an inlet constructed and arranged to receive said filtered airflow, and positioned adjacent to an opposite side of the liquid chemical tank; and directing airflow from the filtered airflow source in a generally horizontal stream over the surface of the liquid chemical to the airflow exhaust inlet, whereby substantially all deleterious fumes emanating from the surface of the chemical are captured by and entrained in the airflow, and flow into the airflow exhaust.

Another aspect of the invention relates to a semiconductor fabrication facility clean room including a ceiling-to-floor laminar airflow system, an exhausted equipment and system comprising a liquid chemical tank for containing a liquid chemical composition producing fumes from a liquid surface thereof, and an air manager assembly including a filtered airflow source and an airflow exhaust inlet arranged in facing relationship to one another at opposing sides of the liquid chemical tank above the liquid surface, with the filtered airflow source and airflow exhaust inlet being constructed and arranged to maintain airflow across the surface of the liquid chemical from the airflow source to the airflow exhaust inlet at an airflow velocity above the Critical Capture Velocity of chemical liquid fumes from the liquid chemical in said liquid chemical tank.

A still further aspect of the invention relates to a method of operating a semiconductor fabrication facility clean room including a ceiling-to-floor laminar airflow system, and an exhausted equipment and system comprising a liquid chemical tank for containing a liquid chemical composition producing fuimes from a liquid surface thereof, said method comprising providing a filtered airflow source and airflow exhaust inlet at opposite sides of the liquid chemical tank above the liquid surface, and directing airflow across the liquid chemical surface from the filtered airflow source to the airflow exhaust inlet at an airflow velocity above the Critical Capture Velocity of chemical liquid fumes from the liquid chemical in said liquid chemical tank.

Various other aspects, features and embodiments of the invention will be more fully apparent from the ensuing disclosure and claims.

DETAILED DESCRIPTION OF THE INVENTION, AND PREFERRED EMBODIMENTS THEREOF

As discussed above in the Background section hereof, conventional push-pull equipment exhaust systems in clean rooms are insufficient to fully capture and remove hazardous fumes from processing stations. In a conventional clean room exhaust system, the influence of the exhaust inlet on volumetric airflow is reduced by 90% just one duct diameter away from the inlet. Thus, for an eight-inch duct, a 200 fpm exhaust flow rate is reduced to 20 fpm eight inches away from the duct inlet. Unobstructed output of the laminar flow filters in the ceiling of a clean room is only attenuated by 90% at a distance greater than 30 diameters. Obstructions may well be present and reduce the laminar airflow by introducing turbulence and separating the air streams, thereby markedly reducing this efficiency, and dramatically attenuating volumetric airflow rates downstream of the obstruction.

Figure 1:
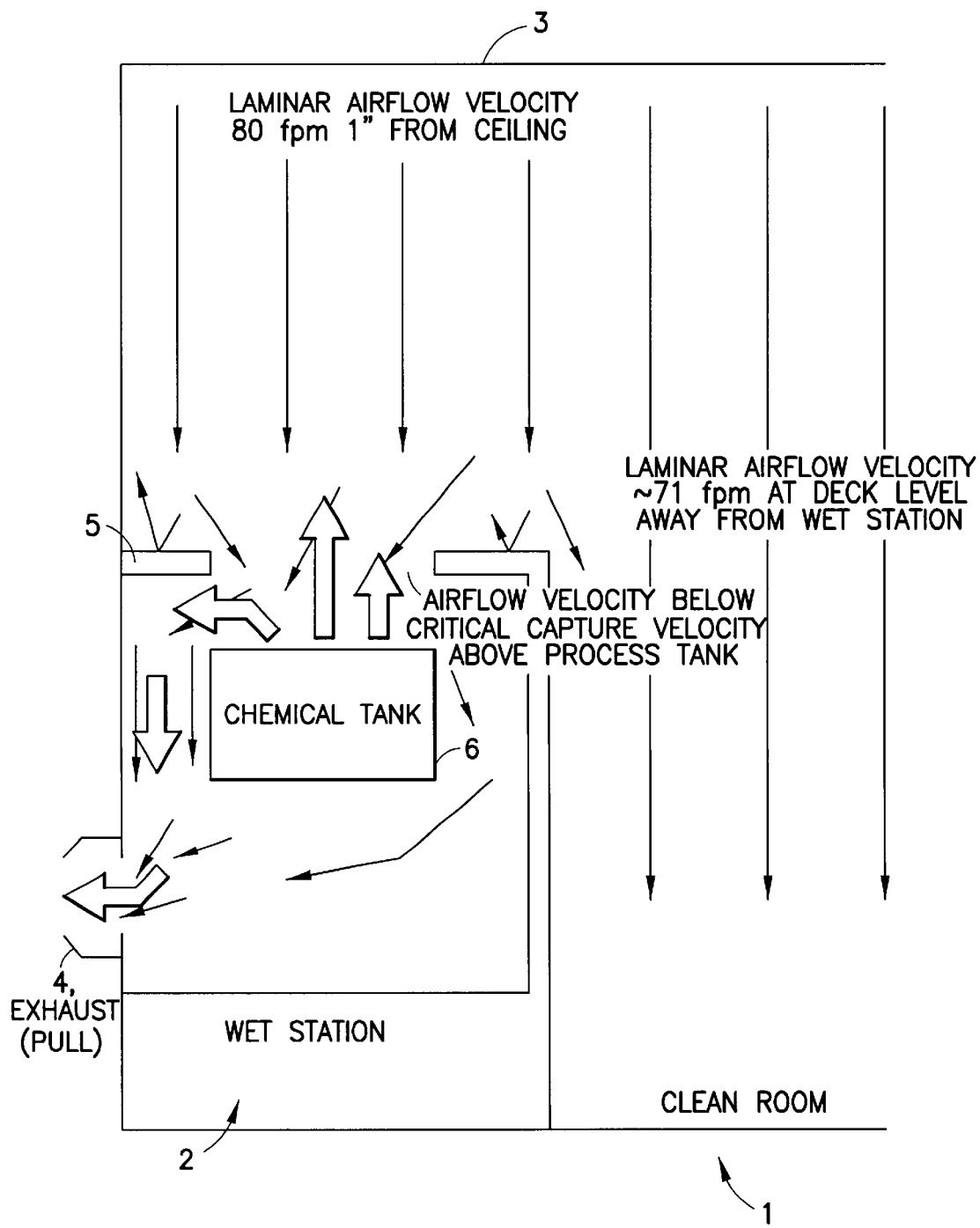
FIG. 1 is a schematic representation depicting airflow in a prior art clean room.

FIG. 1 ("Prior Art") schematically depicts a typical prior art clean room 1 with a processing station 2, and airflow patterns at various locations. Laminar airflow from the ceiling 3 at 80 fpm is provided by the clean room air filtration and circulation system. This airflow comprises the "push" component of the push-pull process station exhaust. The "pull" is provided by an exhaust 4 located beneath the deck 5 at the processing station. Distant from the exhausted equipment and system, the unobstructed laminar airflow velocity is attenuated to approximately 71 fpm at the system deck level.

Above the process chemical tank 6, however, due to turbulence and delamination of the air stream caused by the obstructions of the processing station, airflow is below the Critical Capture Velocity, and is unable to contain all hazardous fuimes emanating from the chemical tank 6. Detailed measurements taken at different points above the chemical tank 6 reveal high airflow velocities at the front and rear of the tank, and low velocities at its center. With some deck and tank installation configurations, it is not uncommon to find airflow velocities over the center of the tank in the 0 to 10 fpm range.

Under these conditions, fuimes control is lost, resulting in a "plume" of hazardous vapors over the center of the tank. Buoyant forces over a heated vessel may exacerbate this weakness and produce a substantial fume cloud. In many applications, a plume above the process tank has been accepted as a necessary concomitant condition of a processing station.

FIG. 1 ("Prior Art") also represents the situation facing currently adequate exhausted equipment and systems exhaust systems (those which balance the push of clean room laminar airflow source, the pull of exhausted equipment and systems exhaust, and the size of the deck opening above the process tank), as larger wafer sizes force the deck opening size to increase and/or necessitate exhaust power at a level beyond the existing system's capacity.

The present invention resolves such deficiency of the prior art by the provision of an exhausted equipment and systems exhaust system that maintains airflow at or above the Critical Capture Velocity over the entire surface of the process tank, by introducing an additional "push" source of alrflow force beneath the deck, proximate to the surface of the tank. This push source, in combination with the pull of the system exhaust, results in an airflow stream across the surface of the tank that is sufficient to capture all hazardous fumes emanating therefrom.

The localized push source dramatically increases the efficiency of airflow management around the tank, allowing a large reduction in the size and energy requirements of the exhaust motor, as compared to reliance on the push of the clean room laminar airflow source. The system also enables the maintenance of a minimum airflow at or above the Critical Capture Velocity for any given processing station, regardless of the wide variation in volume and velocity of clean room laminar airflow characteristic of air management systems from fab to fab.

Figure 2:
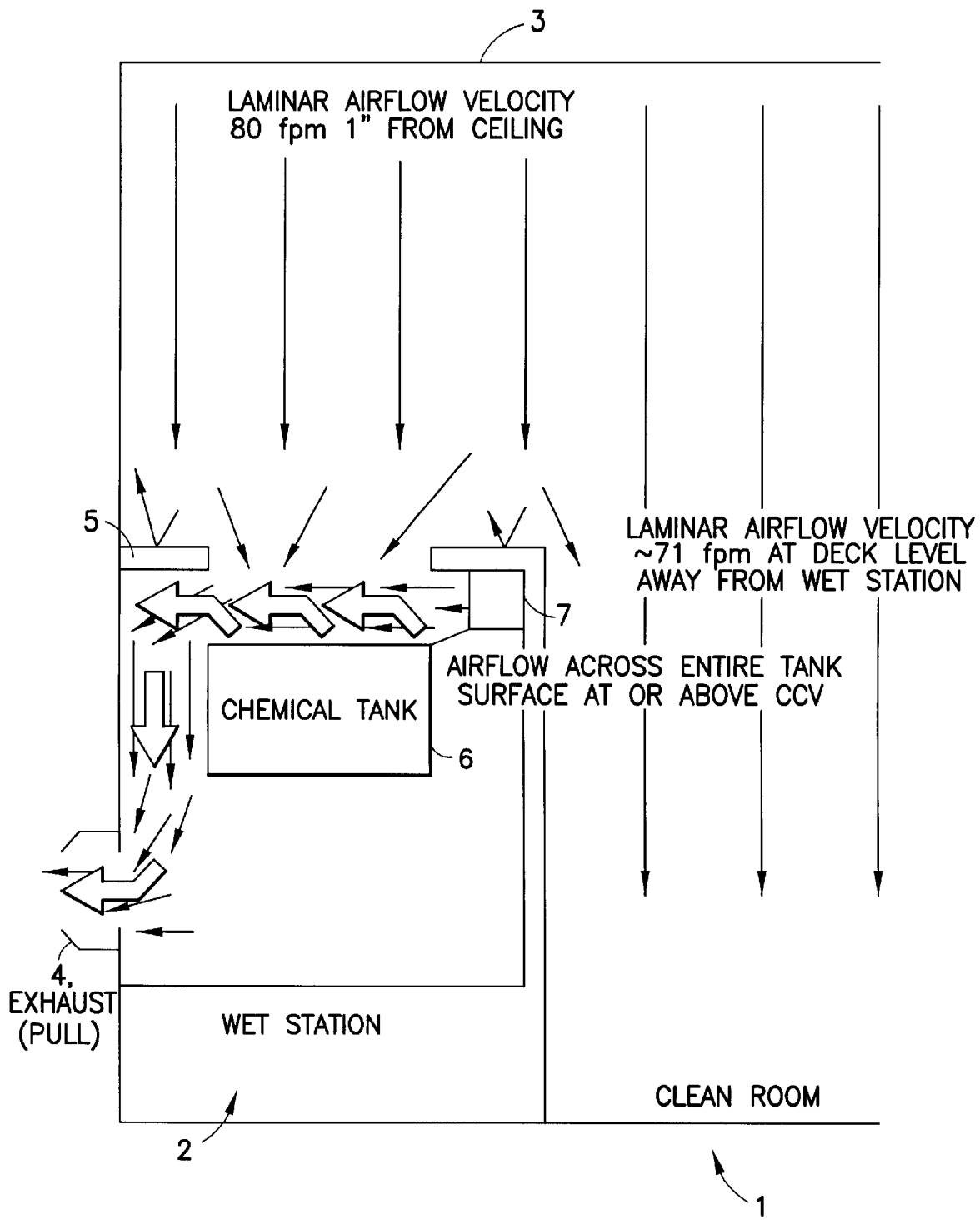
FIG. 2 is a schematic representation depicting airflow in a clean room employing the apparatus of the present invention installed.

FIG. 2, wherein corresponding features and elements are correspondingly numbered with respect to FIG. 1 ("Prior Art"), depicts a processing station 2 in a clean room 1, with the air manager 7 of the present invention installed. The air manager 7 works cooperatively with the clean room laminar airflow (push) and the station exhaust (pull), providing an additional "push" motive force of airflow near the exhaust port. The air manager directs a stream of airflow horizontally across the surface of the tank 6, parallel to the surface of the liquid therein.

This air manager flow, in addition to the clean room laminar airflow entering the deck opening from above the tank, completely captures and directs all chemical fumes emanating from the tank to the exhaust 4 located below the deck 5, with the filtered airflow across the tank being maintained at or above the Critical Capture Velocity.

Figure 3:
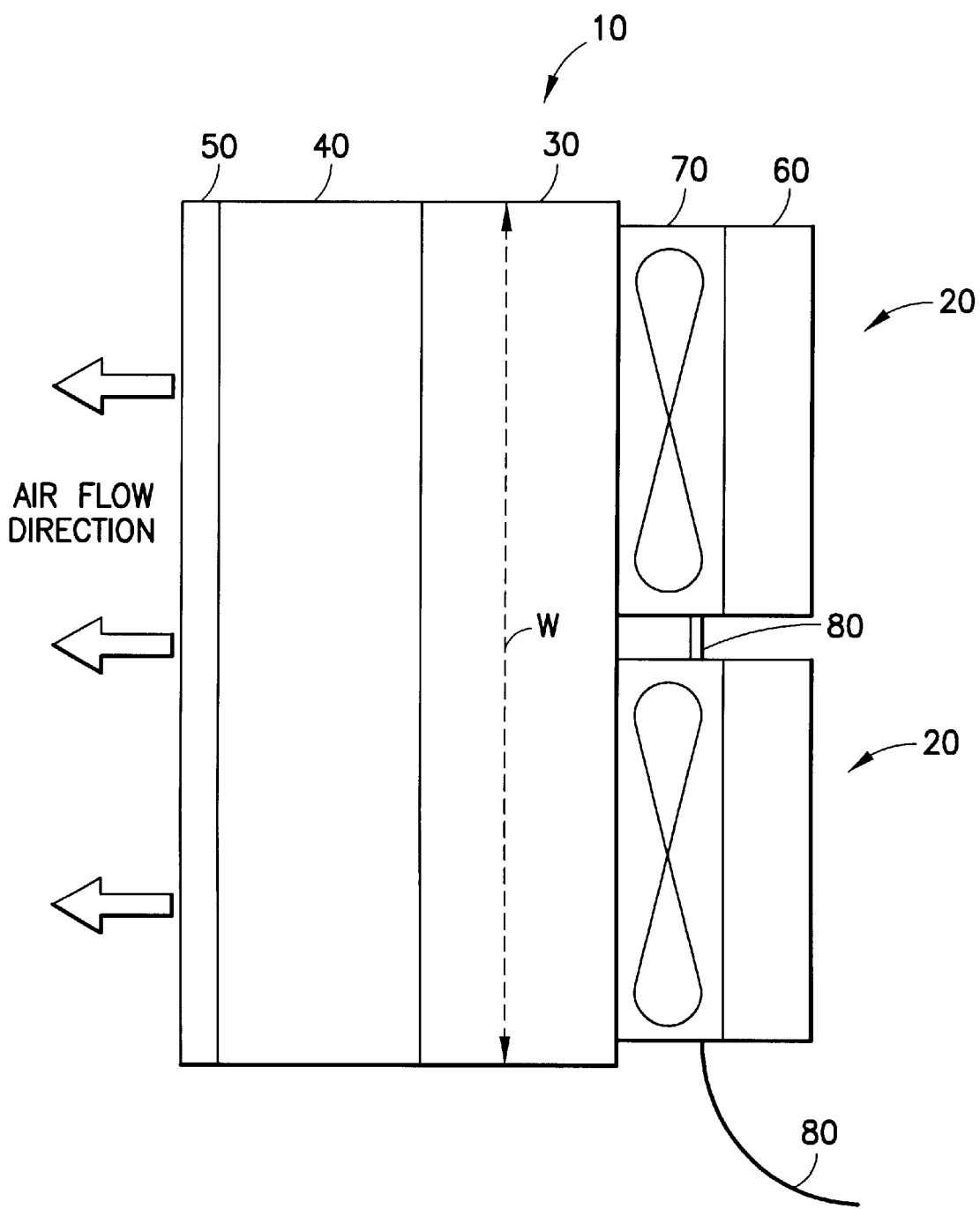
FIG. 3 is a plan view of apparatus according to one embodiment of the present invention.

FIG. 3 is a schematic representation in plan view of an air manager apparatus according to one embodiment of the present invention. The air manager, indicated generally at 10, comprises air plenum 30 and at least one fan assembly, indicated generally at 20 (two fan assemblies are shown in FIG. 3). Air plenum 30, of transverse dimension W as indicated (W corresponding to the transverse dimension, or width, of the chemical tank) contains ULPA filter media 40 and filter grill 50. Fan assembly 20 comprises powered fan 70 and chemisorbent backfilter 60. Fan 70 is powered in any suitable manner, e.g., electrically, and in the embodiment shown is operatively connected by cable 80 to a suitable power source (not shown).

Figure 4A:
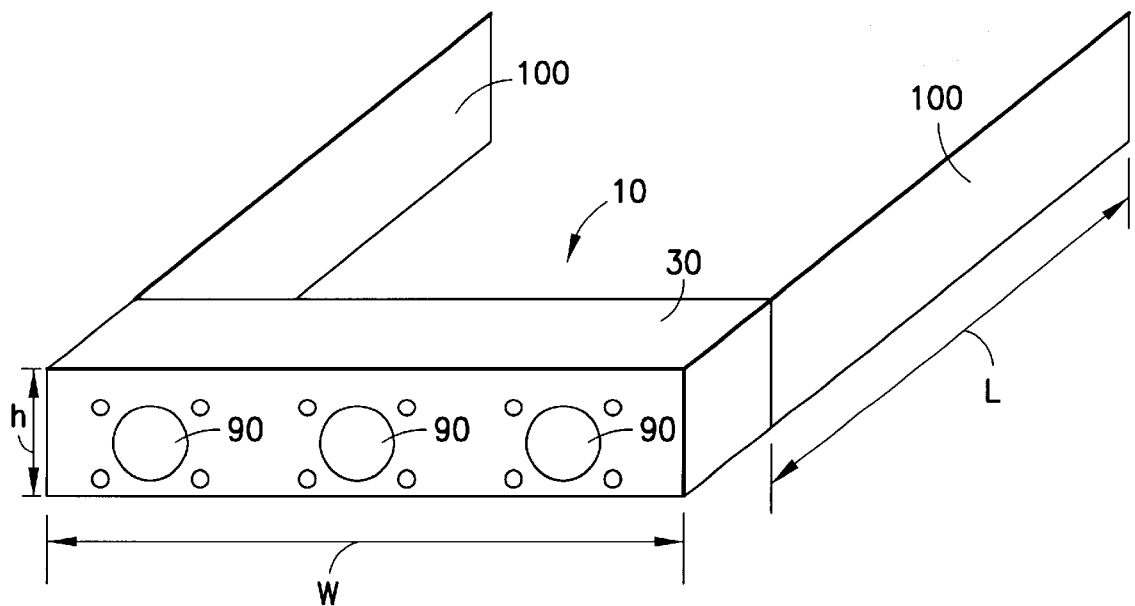
FIGS. 4a and 4b are perspective views of apparatus according to another embodiment of the present invention.

FIG. 4a is a schematic perspective view of the rear side of the air manager 10 according to another embodiment of the present invention. Fan mounting holes 90 are provided in the rear face of the chamber constituting air plenum 30, for the mounting of up to three fan assemblies (not shown). Air plenum 30 is of transverse dimension W as indicated, where W corresponds to the transverse dimension (width) of the chemical tank (transverse to direction of airflow from air manager).

Attached to the sides of air plenum 30 and extending therefrom in the front direction are optional airflow guide panels 100. Airflow guide panels 100 are at least of length L as shown, where L corresponds to the length of the chemical tank (along the direction of airflow from the air manager). Both air plenum 30 and airflow guide panels 100 are of height h as shown, where h corresponds generally to the height of the air manager, in the vertical distance separating the top of the tank from the lower surface of the deck beneath which the tank is positioned.

Figure 4B:
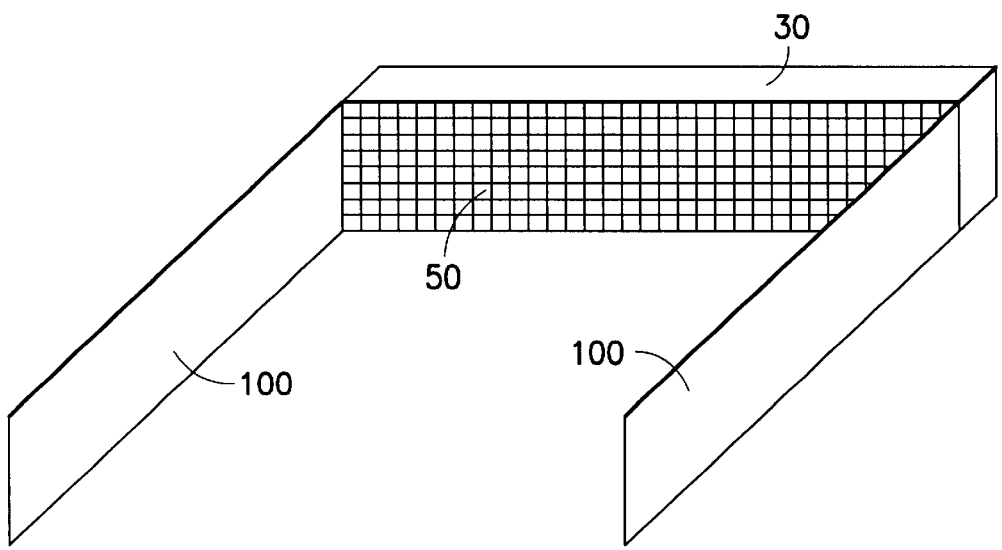

FIG. 4b is a schematic representation in perspective view of the front side of the air manager 10 of FIG. 4a, showing an optional filter grill 50. Filter grill 50 is a regular, porous, air-permeable screen formed of any suitable material, such as, e.g., ¼ PVDF grill (machined) or 80% open Teflon® mesh. Filter grill 50 retains a filtration medium within the body of air plenum 30, while allowing even, high-volume airflow from air plenum 30 to the area over the chemical tank.

In the broad practice of the present invention, the various components of the air manager (fans, etc.) may be interconnected in a variety of ways, and some components (i.e., fans) optionally omitted, as required in any given application, and readily determinable by one of ordinary skill in the art without undue experimentation and without departing from the scope and the spirit of the invention as herein disclosed. In particular, the fan assemblies or other sources of airflow motive force may be integral to the air manager or positioned remotely from the air plenum, and the airflow carried thereto via hoses, pipes, ducts, channel elements, manifolds, etc. Options for airflow motive force include facility Clean Dry Air (CDA), facilities nitrogen ($N_2$) or compressed air from a chase-located compressor.

Most contemporary wet stations are built with protective lids positioned over the process tanks. In one embodiment of the present invention the air manager system potentially alleviates the need for such lids.

EXAMPLE

The air management system of the invention was evaluated in a semiconductor manufacturing facility wet system including a deck that was 128.5 inches in length, overlying a series of process tanks, comprising in sequence a chuck wash tank, a $NH_4OH$ tank, two rinse tanks, two HF tanks, and two rinse tanks.

The $NH_4OH$ tank and one of the HF tanks were studied by velocity profile and fog visualization tests. The deck openings for these tanks were each 11 inches by 15.5 inches. The $NH_4OH$ tank was 16.5 inches wide by 26 inches long, and the HF tank had the same dimensions. Each tank was 11.75 inches tall, and the spacing distance between the upper end of the tank walls and the deck was 6.5 inches. The exhaust box for each tank had an exhaust duct opening 8 inches in diameter.

Measurements were taken at the deck opening above the process tank in each case. The deck opening above each process tank was divided into an imaginary 4×3 grid, and measurements were taken in the center of the resulting imaginary grid openings in the penetration into the deck, approximately 0.75 inch above the opening.

Downflowing laminar air was passed through a HEPA filter into the wet station.

In a first test of the $NH_4OH$ process tank, operated in conventional fashion, without the air management system of the present invention, the laminar airflow above the tank averaged from 90 feet per minute to 120 feet per minute, measured 0.5 inch below the HEPA filter face. The exhaust flow at the duct was 457 cfm. Capture velocities ranged from 200 feet per minute to 320 feet per minute, a variance of 60%. Aggressive exhaust and laminar airflow rates were required to maintain the air under control over this process tank.

An air management system of the type shown in FIG. 2 was installed at the $NH_4OH$ tank. After the air management system was turned on, critical capture velocities were achieved and maintained. The installation of the air management system was determined to reduce the average HEPA filter airflow velocity to 43 feet per minute, resulting in a 35% reduction in air requirement. Tool exhaust was reduced to 1000 cfm from 1537 cfm. The exhaust flow rate was reduced from 457 cfm to 231 cfm, a 49% reduction. Concurrently, airflow over the deck was more uniform and less turbulent because of the lower air and exhaust requirements made possible by the addition of the air management system.

In the HF tank, prior to installation of the air management system, laminar airflow averaged 61 feet per minute, measured 0.5 inch below the face of the HEPA filter, and the exhaust flow rate was 447 cfm. Capture velocities ranged from 130 feet per minute to 210 feet per minute, a variance of 38%. Aggressive exhaust and laminar airflow rates were required to control the air over the process tank.

After installation of an air management system of the type shown in FIG. 2 on the HF tank, the air management system was turned on, and critical capture velocities were achieved and maintained. Turbulence was no longer evident at the tank level, and exhaust was reduced to 375 cfm from 447 cfm, a 16% reduction, and the velocity of the laminar airflow at the face of the HEPA filter was reduced to 43 feet per minute, resulting in a 35% reduction in air requirement, with tool exhaust being reduced from 1537 cfm to 1000 cfm.

Fog visualization tests conducted on the $NH_4OH$ and the HF tanks before and after installation/operation of the air management system revealed that fume capture was not complete in the original wet station, and that after installation of the air management system, all flumes appeared to be captured by the operation of the air management system.

While the invention has been described herein with respect to various illustrative aspects, features and embodiments, it will be recognized that the invention is not thus limited, but that the present invention extends to and encompasses other features, modifications, and alternative embodiments, as will readily suggest themselves to those of ordinary skill in the art based on the disclosure and illustrative teachings herein. The claims that follow are therefore to be construed and interpreted as including all such features, modifications and alternative embodiments, within their spirit and scope.

What is claimed is:

1. An air manager and chemical tank assembly, comprising:

a filtered airflow source constructed and arranged to direct airflow in an airflow stream;

a liquid chemical tank arranged to contain a liquid producing deleterious fumes at said liquid's surface, and an airflow exhaust having an inlet for receiving said airflow;

wherein the filtered airflow source and airflow exhaust are positioned in relation to one another so that airflow from the filtered airflow source is directed over the surface of the liquid and into the exhaust inlet, whereby substantially all deleterious fumes produced at the surface of the chemical are captured by and entrained in the airflow, and transported to the exhaust.

2. The air manager and chemical tank assembly of claim 1, wherein the filtered airflow source is positioned above and adjacent to one side of the liquid chemical tank and the inlet to the powered exhaust is positioned in proximity to an opposite side of the liquid chemical tank.

3. The air manager and chemical tank assembly of claim 1, wherein the filtered airflow source is positioned above and adjacent to opposing sides of the liquid chemical tank.

4. The air manager and chemical tank assembly of claim 1, wherein the airflow stream from the filtered airflow source is directed parallel to said liquid's surface.

5. The air manager and chemical tank assembly of claim 1, wherein the filtered airflow source comprises at least one airflow purification medium, selected from the group consisting of particulate filter media and chemisorbent media.

6. The air manager and chemical tank assembly of claim 1, further comprising at least two airflow guides extending from the airflow source to the airflow exhaust inlet and positioned above an adjacent side of the liquid chemical container, whereby the airflow guides direct the filtered airflow to the area over the liquid chemical surface.

7. The air manager and chemical tank assembly of claim 1, wherein the liquid chemical tank is located beneath a deck in a semiconductor manufacturing clean room wet chemical processing station, wherein the airflow exhaust is located remotely from an upper edge of the liquid chemical tank opposite the filtered airflow source, and wherein the airflow exhaust inlet is defined by a space above the liquid chemical tank opposite the airflow source and below the deck, with an opening in the deck over the liquid chemical tank for ingress and egress of semiconductor manufacturing workpieces.

8. The air manager and chemical tank assembly of claim 7, further comprising a laminar downflow air source overlying the deck and chemical tank.

9. A wet station assembly of a semiconductor manufacturing facility, said wet station assembly comprising:
   a deck having a liquid chemical tank positioned beneath the deck, with an opening in the deck over the liquid chemical tank for ingress and egress of semiconductor manufacturing workpieces;
   a laminar downflow air source;
   a below-deck exhaust for the wet station assembly; and
   a below-deck airflow source positioned in relation to the exhaust to flow an airstream over a surface of liquid in the liquid chemical tank at a sufficient rate and in a sufficient volumetric flow to achieve Critical Capture Velocity (CCV) of vapor released from the liquid during operation of the wet station assembly.

10. The wet station assembly of claim 9, wherein the CCV is in the vicinity of 70 feet per minute.

11. The wet station assembly of claim 9, wherein the airflow source comprises an air plenum member, a purification medium in the air plenum member, and a motive air driver to induce flow of air through the plenum member for egress from the plenum member to flow across the liquid surface.

12. The wet station assembly of claim 11, wherein the airflow source comprises a chemisorbent medium for purification of influent air.

13. The wet station assembly of claim 9, further comprising airflow guide panels coupled with the plenum member and arranged to direct airflow therefrom across the liquid surface.

14. The wet station assembly of claim 9, further comprising a robotic wafer transport device arranged to introduce a semiconductor wafer into the liquid chemical tank for processing therein, and to remove the semiconductor wafer from the liquid chemical tank after processing therein.

15. A method of containing fumes emanating from a surface of a liquid in a liquid chemical tank, comprising:
   providing a filtered airflow source and an airflow exhaust having an inlet constructed and arranged to receive said airflow;
   positioning the filtered airflow source and the airflow exhaust inlet in relation to one another and to the tank, so that airflow from the filtered airflow source flows over the surface of the liquid in the liquid chemical tank to the airflow exhaust inlet; and
   flowing an airflow from the filtered airflow source in a generally horizontal stream over the surface of the liquid chemical to the airflow exhaust inlet, whereby substantially all deleterious fumes emanating from the surface of the liquid are captured by and entrained in the airflow, and flow into the airflow exhaust.

16. The method of claim 15, further comprising confining the airflow to a region above the surface of the liquid by guide structures at sides of the tank.

17. A method of increasing the efficiency of the localized exhaust in exhausted equipment and systems within a semiconductor manufacturing clean room, comprising the steps of:
   retrofitting the clean room to comprise an air manager and chemical tank assembly comprising:
      a filtered airflow source that produces an airflow stream;
      a liquid chemical tank, wherein a liquid contained within said liquid chemical tank produces fumes at said liquid's surface, wherein said fumes are contained within said liquid chemical tank, and wherein said airflow stream is directed over said liquid's surface to entrain said fumes; and
      an airflow exhaust having an inlet for receiving said airflow stream with said entrained fumes, and wherein said airflow stream with said entrained fumes are transported to the exhaust.

18. A semiconductor fabrication facility clean room comprising:
   a ceiling-to-floor laminar airflow system;
   a set of exhaust equipment; and
   at least one system comprising:
      a liquid chemical tank for containing a liquid chemical composition producing fumes from a liquid surface thereof; and
      an air manager assembly including a filtered airflow source and an airflow exhaust inlet arranged in facing relationship to one another at opposing sides of the liquid chemical tank above the liquid surface with the filtered airflow source and airflow exhaust inlet being constructed and arranged to maintain airflow across the surface of the liquid chemical from the filtered airflow source to the airflow exhaust inlet at an airflow velocity above the Critical Capture Velocity of chemical liquid fumes from the liquid chemical in said liquid chemical tank.

19. A method of operating a semiconductor fabrication facility clean room including a ceiling-to-floor laminar airflow system, and exhausted equipment and systems comprising a liquid chemical tank for containing a liquid chemical composition producing fumes from a liquid surface thereof, said method comprising the steps of:
   providing a filtered airflow source and airflow exhaust inlet at opposite sides of the liquid chemical tank above the liquid surface; and
   directing airflow across the liquid chemical surface from the filtered airflow source to the airflow exhaust inlet at an airflow velocity above the Critical Capture Velocity of chemical liquid fumes from the liquid chemical in said liquid chemical tank.-

20. An air manager and chemical tank assembly, comprising:

a filtered airflow source that produces an airflow stream;

a liquid chemical tank, wherein a liquid contained within said liquid chemical tank produces fumes at said liquid's surface, wherein said fumes are contained within said liquid chemical tank, and wherein said airflow stream is directed over said liquid's surface to entrain said fumes; and an airflow exhaust having an inlet for receiving said airflow stream with said entrained fumes, and wherein said airflow stream with said entrained fumes are transported to the exhaust.

\* \* \* \* \*